(12) United States Patent
Kim et al.

(10) Patent No.: US 7,898,072 B2
(45) Date of Patent: Mar. 1, 2011

(54) PACKAGE STACKING SYSTEM WITH MOLD CONTAMINATION PREVENTION

(75) Inventors: YoungJoon Kim, Ichon-si (KR); YoRim Lee, Koyang-si (KR)

(73) Assignee: Stats Chippac Ltd., Singapore (SG)

( * ) Notice: Subject to any disclaimer, the term of this patent is extended or adjusted under 35 U.S.C. 154(b) by 182 days.

(21) Appl. No.: 12/171,890

(22) Filed: Jul. 11, 2008

(65) Prior Publication Data

US 2010/0007000 A1 Jan. 14, 2010

(51) Int. Cl.
*H01L 23/02* (2006.01)

(52) U.S. Cl. .............. 257/686; 257/712; 257/777; 257/778; 257/E23.169; 438/106; 438/108

(58) Field of Classification Search ......... 257/680–690, 257/778–780; 438/106–127
See application file for complete search history.

(56) References Cited

U.S. PATENT DOCUMENTS

| 6,452,268 | B1 | 9/2002 | Huang | |
|---|---|---|---|---|
| 6,861,288 | B2 | 3/2005 | Shim et al. | |
| 6,870,274 | B2 | 3/2005 | Huang | |
| 7,187,067 | B2 | 3/2007 | Weng et al. | |
| 7,192,798 | B2 | 3/2007 | Okada et al. | |
| 2005/0285258 | A1* | 12/2005 | Chen et al. | 257/706 |
| 2009/0283888 | A1* | 11/2009 | Choi et al. | 257/686 |

* cited by examiner

*Primary Examiner*—Dung A. Le
(74) *Attorney, Agent, or Firm*—Mikio Ishimaru

(57) ABSTRACT

A package stacking system includes: providing a package substrate; mounting an integrated circuit over the package substrate; forming a step-down interposer over the integrated circuit; and molding a stack package body, having a step profile, on the package substrate and the step-down interposer.

14 Claims, 3 Drawing Sheets

PACKAGE STACKING SYSTEM WITH MOLD CONTAMINATION PREVENTION

TECHNICAL FIELD

The present invention relates generally to integrated circuit packaging, and more particularly to a system for manufacturing package-on-package stacks without generating mold contamination.

BACKGROUND ART

The BGA (Ball Grid Array) integrated circuit package allows an integrated circuit package to be made very small in size while nevertheless providing highly integrated functionality from a single integrated circuit package. By the BGA technology, a substrate is used as the chip carrier for the mounting of at least one integrated circuit chip, and an encapsulating body is then formed to encapsulate the integrated circuit chip. The encapsulating body is typically formed through the use of an encapsulating mold including an upper mold and an opposing lower mold.

In the fabrication of an encapsulating body for a BGA integrated circuit an integrated circuit chip mounted on a substrate. During the molding process, the semi-finished package configuration of the integrated circuit chip and the substrate is clamped between an upper mold cap and a lower mold chase. The upper mold cap is formed with an encapsulating-body cavity. When the upper mold cap and the lower mold chase are combined, an encapsulating material such as epoxy resin is filled into the encapsulating-body cavity to thereby form an encapsulating body therein.

In the foregoing integrated circuit package configuration, since the substrate would have a thickness deviation of +/−0.05 mm due to imprecision in fabrication, it would lead to the following problems during the molding process when the upper mold cap and the lower mold chase are combined to clamp the substrate.

First, when the substrate is being clamped forcibly by the two mold halves, the thicker part thereof would be unduly pressed, thus resulting in the undesired forming of microcracks in the solder mask coated over the substrate, which would adversely affect the reliability of the internal circuitry of the resulted integrated circuit package.

Second, if the clamping force is reduced to prevent the above-mentioned problem, it would nevertheless allow a gap to be left between the bottom surface of the upper mold cap and the top surface of the thinner part of the substrate, which would allow the flowing resin used in the molding process to flow through this gap, thus undesirably resulting in a mold contamination, commonly known as "flash", over the top surface of the substrate. Although the flash can be later cleaned away, it would increase the overall manufacture cost and degrade the quality of the manufactured package.

In the assembly of package-on-package systems these problems are further exaggerated. If too much pressure is exerted by the upper mold cap, the stack may be damaged. Additionally any tolerance in the thickness of the stack may result in flash covering or partly covering electrical contacts used for electrically connecting additional integrated circuit packages. Many efforts have been made to limit or eliminate the occurrence of flash in the packaging of integrated circuits, but none have been completely successful in eliminating this manufacturing yield problem.

Thus, a need still remains for package stacking system with mold contamination prevention. In view of the demand for high volume and high quality integrated circuit systems, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package stacking system including providing a package substrate; mounting an integrated circuit over the package substrate; forming a step-down interposer over the integrated circuit; and molding a stack package body, having a step profile, on the package substrate and the step-down interposer.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
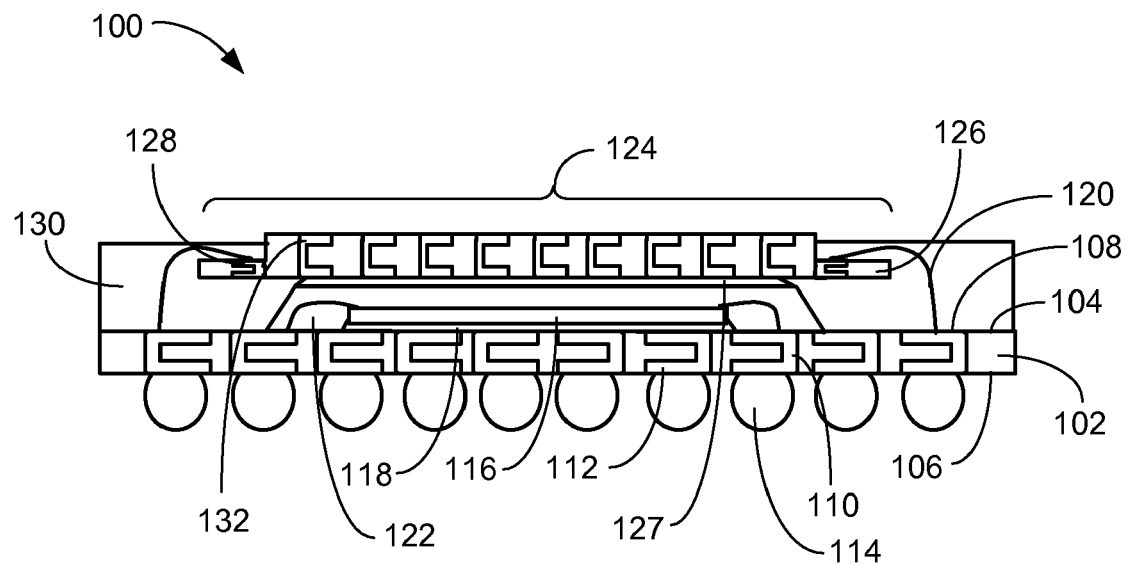
FIG. 1 is a cross-sectional view of a package stacking system with mold contamination prevention, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of a package stacking system 100 with mold contamination prevention, in an embodiment of the present invention. The cross-sectional view of the package stacking system 100 depicts a package substrate 102 having a component side 104 and a system side 106. A component contact 108, formed on the component side, may be coupled by a via 110 to a system contact 112, formed on the system side 106. System interconnects 114, such as solder balls, solder columns, solder bumps, or stud bumps, may be coupled to the system contacts 112.

An integrated circuit 116, such as a wire bond type, may be mounted on the component side 104 by an adhesive 118. The integrated circuit 116 may be coupled to the component contact 108 by an electrical interconnect 120, such as a bond wire. A first package body 122 may be formed on the integrated circuit 116, the electrical interconnects, and the component side 104 by molding an epoxy molding compound or the like.

A step-down interposer 124 may be formed by cutting a step 126, by mechanical sawing or laser trenching, on the perimeter of the step-down interposer 124. The step 126 may have a thickness in the range of 25% to 50% of the maximum thickness of the step-down interposer 124.

The step-down interposer 124 may be mounted on the first package body 122 by a package adhesive 127, such as a die attach material or an epoxy compound. A step contact 128 may be formed on the step 126 for coupling the electrical interconnect 120 to the component contact 108. The electrical interconnect 120 may have a shortened loop height in order to provide a clearance between the electrical interconnect and a top surface of a stack package body 130. The stack package body 130 may have a minimum clearance, below the plane of the top surface of the step-down interposer 124, in the range of 0.30 mm to 0.75 mm.

External component contacts 132 may be formed in a pattern across the step-down interposer 124. The external component contacts 132 may provide a mounting surface for external components (not shown) such as integrated circuit packages, discrete components, or combinations thereof. An electrical connection may be formed between the external component contacts 132, the system interconnects 114, the integrated circuit 116, or a combination thereof.

Figure 2:
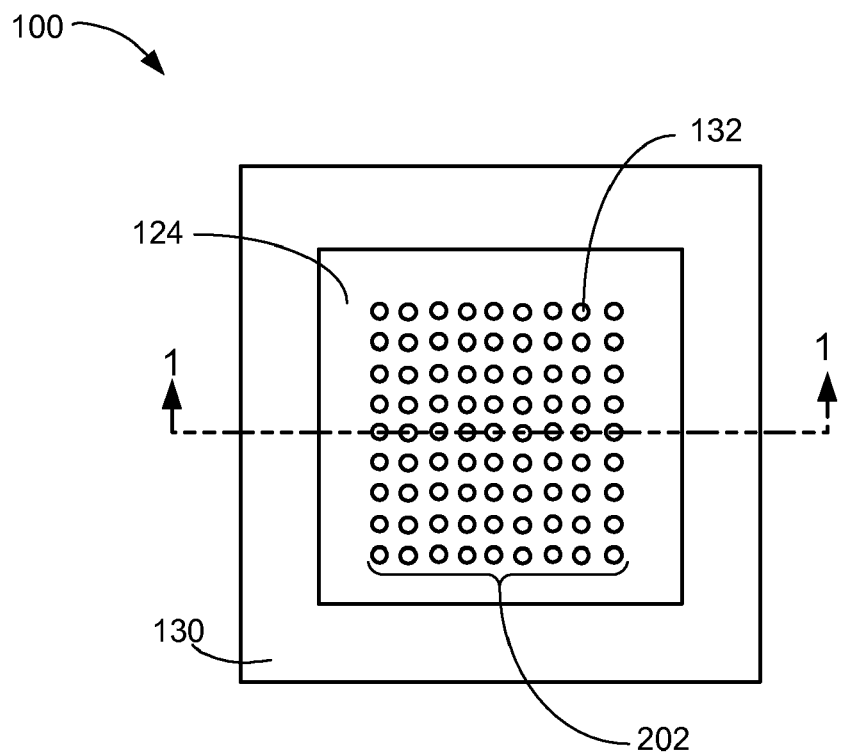
FIG. 2 is a top view of the package stacking system of FIG. 1.

Referring now to FIG. 2, therein is shown a top view of the package stacking system 100 of FIG. 1. The top view of the package stacking system 100 depicts the stack package body 130 formed around the step-down interposer 124. A pattern 202 of the external component contacts 132 may be formed in the step-down interposer 124. A section line 1-1 may show the position and direction of view taken for FIG. 1 and subsequent figures.

The pattern 202 is shown as an example only. The pattern 202 may actually be adapted for the particular external components (not shown) that will be coupled to the package stacking system 100.

Figure 3:
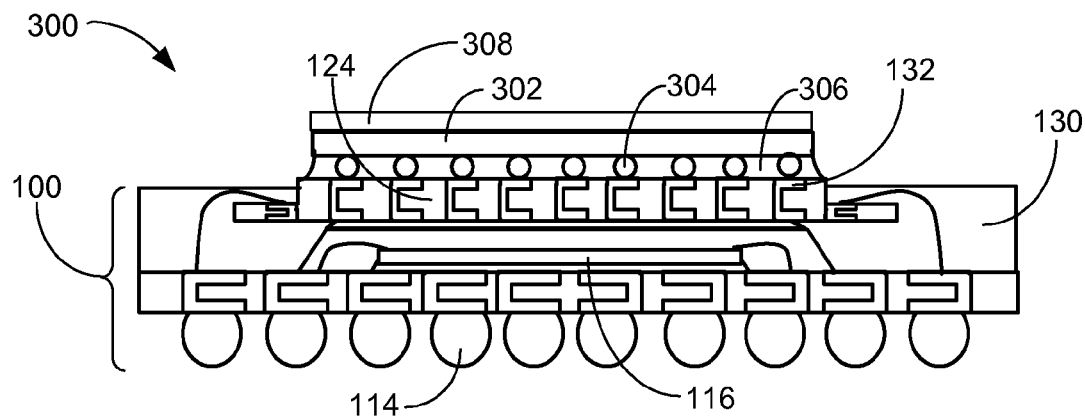
FIG. 3 is a cross-sectional view, similar to FIG. 1, of a package stacking system, in an embodiment of the present invention.

Referring now to FIG. 3, therein is shown a cross-sectional view, similar to FIG. 1, of a package stacking system 300, in an embodiment of the present invention. The cross-sectional view of the package stacking system 300 depicts the package stacking system 100 having a flip chip integrated circuit 302 coupled to the external component contacts 132 by chip interconnects 304. A chip sealer 306, such as an under fill material, may be injected between the step-down interposer 124 and the flip chip integrated circuit 302 for protecting the active surface of the flip chip integrated circuit 302. A heat spreader 308 may optionally be attached to the inactive side of the flip chip integrated circuit 302 for improving thermal performance.

An electrical connection may be formed between the flip chip integrated circuit 302, the system interconnects 114, the integrated circuit 116, or a combination thereof The flip chip integrated circuit 302 shown is by way of an example only and any configuration of the flip chip integrated circuit 302 may be coupled to the step-down interposer 124. Since the stack package body 130 is manufactured to be below the plane of the external component contacts 132, the flip chip integrated circuit 302 may extend beyond the step-down interposer 124 and over the stack package body 130.

Figure 4:
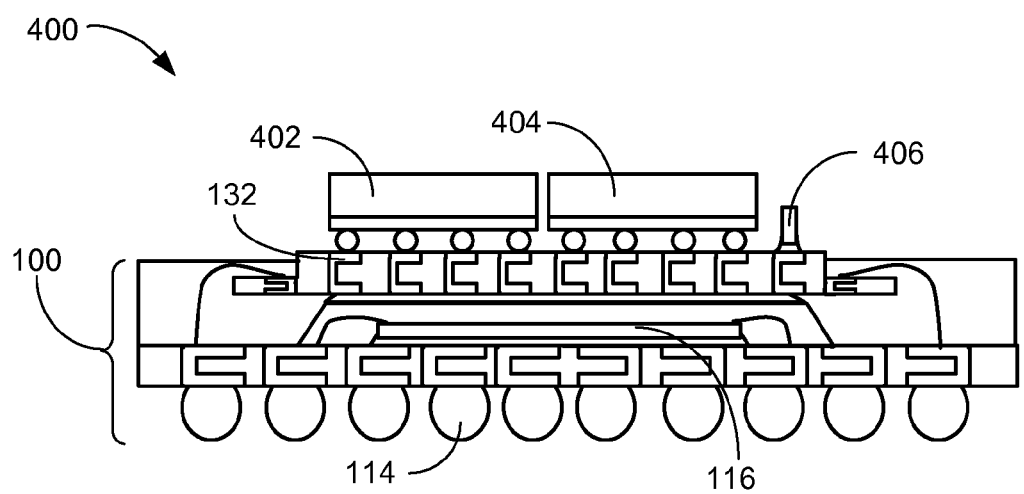
FIG. 4 is a cross-sectional view, similar to FIG. 1, of a package stacking system, in another embodiment of the present invention.

Referring now to FIG. 4, therein is shown a cross-sectional view, similar to FIG. 1, of a package stacking system 400, in another embodiment of the present invention. The cross-sectional view of the package stacking system 400 depicts the package stacking system 100 having a first integrated circuit package 402, such as a ball grid array package, a leaded package, a leadless package, or a chip scale package, coupled to the external component contacts 132 of the package stacking system 100. A second integrated circuit package 404, such as a ball grid array package, a leaded package, a leadless package, or a chip scale package, may also be coupled to the external component contacts 132 of the package stacking system 100. A discrete component 406, such as a resistor, a capacitor, an inductor, a voltage regulator, a transformer, a transistor, or a combination thereof, may be coupled to the external component contacts 132.

An electrical connection may be formed between the first integrated circuit package 402, the second integrated circuit package 404, the discrete component 406, the system interconnects 114, the integrated circuit 116, or a combination thereof. This configuration is an example only and any number of the integrated circuit packages 402 or the discrete components 406 may be coupled to the external component contacts 132.

Figure 5:
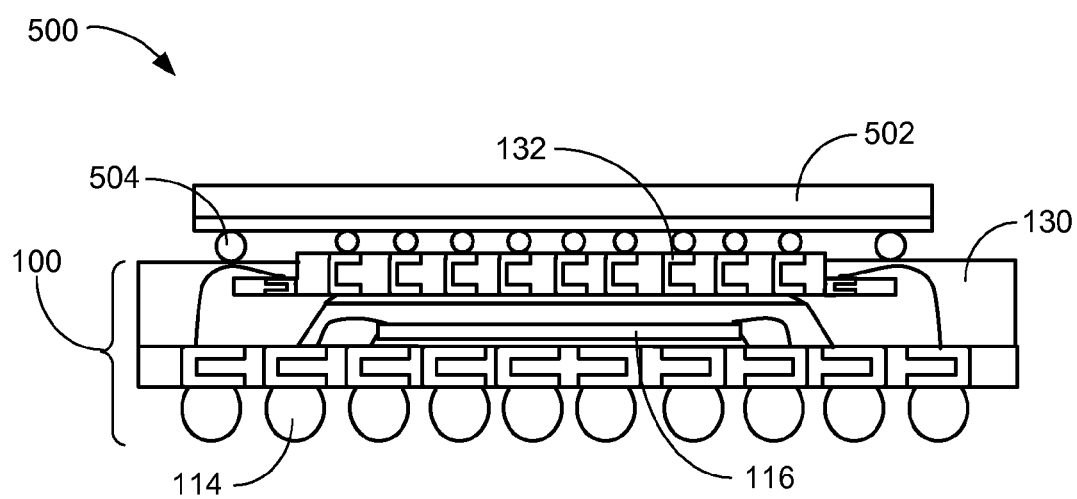
FIG. 5 is a cross-sectional view, similar to FIG. 1, of a package stacking system, in yet another embodiment of the present invention.

Referring now to FIG. 5, therein is shown a cross-sectional view, similar to FIG. 1, of a package stacking system 500, in yet another embodiment of the present invention. The cross-sectional view of the package stacking system 500 depicts the package stacking system 100 having an oversized integrated circuit package 502, such as a ball grid array package, electrically connected to the external component contacts 132. An adhesive dot 504 may be adhered between the oversized integrated circuit package 502 and the stack package body 130. The adhesive dot 504 may prevent the oversized integrated circuit package 502 from tilting during a reflow assembly process.

The oversized integrated circuit package 502 is an example only and an external component of any size may be coupled to the external component contacts 132. The oversized integrated circuit package 502 may extend across the full area of the stack package body 130, or cover any portion of it. As well, any number of the adhesive dot 504 may be used to stabilize the oversized integrated circuit package 502.

Figure 6:
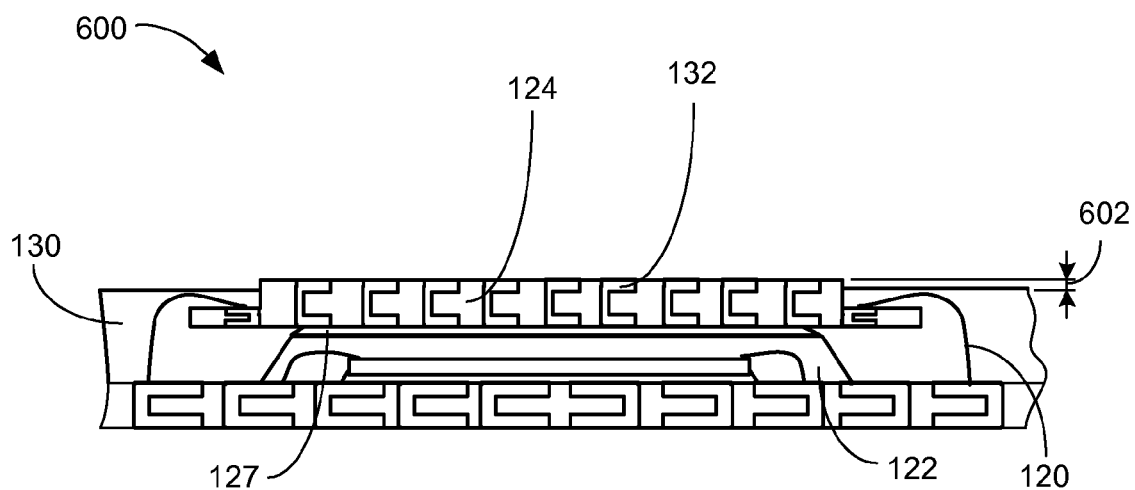
FIG. 6 is a cross-sectional view of the package stacking system with mold contamination prevention, in a molding phase of manufacturing.

Referring now to FIG. 6, therein is shown a cross-sectional view of the package stacking system 600 with mold contamination prevention, in a molding phase of manufacturing. The cross-sectional view of the package stacking system 600 depicts the step-down interposer 124 mounted over the first package body 122 by the package adhesive 127. The molding process may establish a step profile 602, such as the minimum clearance between the plane of the external component contacts 132 and the surface of the stack package body 130.

The molding process may form a seal over the step-down interposer 124 for providing the step profile 602. The molding process may provide the step profile 602 in the range of 0.03 mm to 0.075 mm. The stack package body 130 may also encase the electrical interconnects 120 with a depth in the range of 0.02 mm to 0.085 mm.

It has been discovered that by providing the step profile 602 in the molding process, all of the molding contamination or flash may be prevented. The result of this process is the simplification of the manufacturing flow by eliminating the flash inspection and rework steps from the flow. By eliminating the flash, a reliable electrical connection may be formed when coupling an external component (not shown) thus enhancing the reliability and manufacturability of the package stack (not shown).

Figure 7:
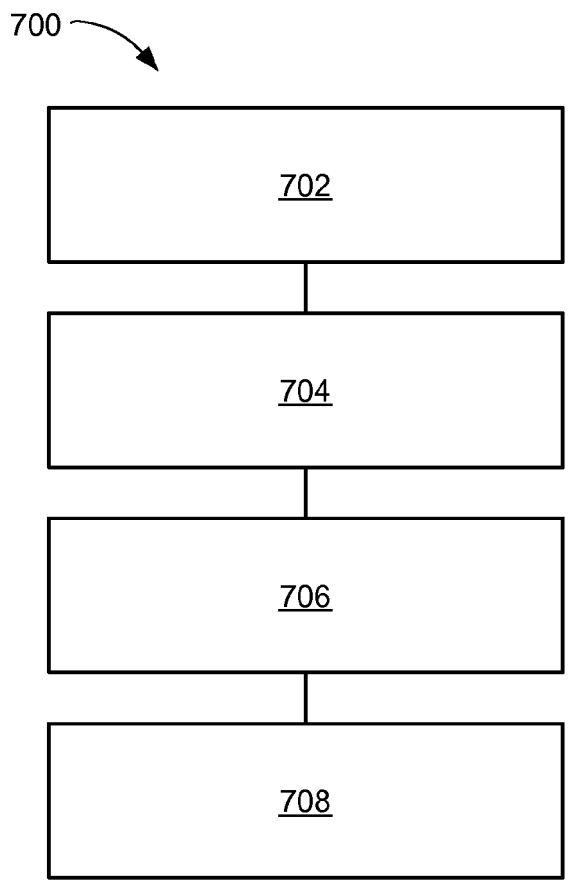
FIG. 7 is a flow chart of a package stacking system for manufacturing the package stacking system with mold contamination prevention in an embodiment of the present invention.

Referring now to FIG. 7, therein is shown a flow chart of a package stacking system 700 for manufacturing the package stacking system 100 with mold contamination prevention in an embodiment of the present invention. The system 700 includes providing a package substrate in a block 702; mounting an integrated circuit over the package substrate in a block 704; forming a step-down interposer over the integrated circuit in a block 706; and molding a stack package body, having a step profile, on the package substrate and the step-down interposer in a block 708.

In greater detail, a system to manufacture the package stacking system with mold contamination prevention, according to an embodiment of the present invention, is performed as follows:

1. Providing a package substrate including forming a component contact, a system contact, and coupling a system interconnect to the system contact. (FIG. 1)
2. Mounting an integrated circuit over the package substrate including forming a first package body on the integrated circuit and the package substrate. (FIG. 1)
3. Forming a step-down interposer over the integrated circuit including applying an adhesive between the step-down interposer and the first package body. (FIG. 1) and
4. Molding a stack package body, having a step profile, on the package substrate and the step-down interposer including covering a step formed in the step-down interposer. (FIG. 1)

It has been discovered that the present invention thus has numerous aspects.

An aspect that has been discovered is that the present invention may completely eliminate the occurrence of molding contamination or flash.

Another aspect is that the step profile of the present invention may provide sufficient clearance to attach an oversized external device that may be stabilized by the use of adhesive dots between the stack package body and the oversized external device.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the package stacking system of the present invention furnishes important and heretofore unknown and unavailable solutions, capabilities, and functional aspects for manufacturing low profile base packages for package stacking. The resulting processes and configurations are straightforward, cost-effective, uncomplicated, highly versatile and effective, can be surprisingly and unobviously implemented by adapting known technologies, and are thus readily suited for efficiently and economically manufacturing stacked package devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of a package stacking system comprising:
    providing a package substrate including forming a component contact, a system contact, and coupling a system interconnect to the system contact;
    mounting an integrated circuit over the package substrate including forming a first package body on the integrated circuit and the package substrate;
    forming a step-down interposer over the integrated circuit including applying a package adhesive between the step-down interposer and the first package body; and
    molding a stack package body, having a step profile, on the package substrate and the step-down interposer including covering a step formed in the step-down interposer.

2. The method as claimed in claim 1 further comprising coupling an electrical interconnect between the package substrate and the step-down interposer including coupling a step contact to the component contact on the package substrate.

3. The method as claimed in claim 1 further comprising coupling a flip chip integrated circuit to the step-down interposer including coupling an external component contact on the step-down interposer for forming an electrical connection between the flip chip integrated circuit, the integrated circuit, the system interconnect, or a combination thereof.

4. The method as claimed in claim 1 further comprising coupling a first integrated circuit package to the step-down interposer including coupling a second integrated circuit, a discrete component, or a combination thereof.

5. The method as claimed in claim 1 further comprising coupling an oversized integrated circuit package to the step-down interposer including positioning an adhesive dot between the stack package body and the oversized integrated circuit package.

6. A package stacking system comprising:
- a package substrate including a component contact, a system contact, and a system interconnect coupled to the system contact;
- an integrated circuit over the package substrate with a first package body on the integrated circuit and the package substrate;
- a step-down interposer over the integrated circuit with a package adhesive between the step-down interposer and the first package body; and
- a stack package body, having a step profile, molded on the package substrate and the step-down interposer with a step formed in the step-down interposer covered by the stack package body.

7. The system as claimed in claim 6 further comprising an electrical interconnect between the package substrate and the step-down interposer.

8. The system as claimed in claim 6 further comprising a flip chip integrated circuit coupled to the step-down interposer.

9. The system as claimed in claim 6 further comprising a first integrated circuit package coupled to the step-down interposer.

10. The system as claimed in claim 6 further comprising an oversized integrated circuit package coupled to the step-down interposer.

11. The system as claimed in claim 6 further comprising an electrical interconnect between the package substrate and the step-down interposer includes a step contact coupled to the component contact on the package substrate.

12. The system as claimed in claim 6 further comprising a flip chip integrated circuit coupled to the step-down interposer includes an external component contact on the step-down interposer for forming an electrical connection between the flip chip integrated circuit, the integrated circuit, the system interconnect, or a combination thereof.

13. The system as claimed in claim 6 further comprising a first integrated circuit package coupled to the step-down interposer includes a second integrated circuit, a discrete component, or a combination thereof coupled to the step-down interposer.

14. The system as claimed in claim 6 further comprising an oversized integrated circuit package coupled to the step-down interposer includes an adhesive dot between the stack package body and the oversized integrated circuit package.

* * * * *